United States Patent
Oh et al.

(10) Patent No.: US 9,842,987 B2
(45) Date of Patent: Dec. 12, 2017

(54) MAGNETIC TUNNEL JUNCTION MEMORY DEVICES INCLUDING CRYSTALLIZED BORON-INCLUDING FIRST MAGNETIC LAYER ON A TUNNEL BARRIER LAYER AND LOWER BORON-CONTENT SECOND MAGNETIC LAYER ON THE FIRST MAGNETIC LAYER

(71) Applicants: SeChung Oh, Hwaseong-si (KR); JoonMyoung Lee, Suwon-si (KR)

(72) Inventors: SeChung Oh, Hwaseong-si (KR); JoonMyoung Lee, Suwon-si (KR)

(73) Assignee: SAMSUNG ELECTRONICS CO., LTD, Gyeonggi-Do (KR)

( * ) Notice: Subject to any disclaimer, the term of this patent is extended or adjusted under 35 U.S.C. 154(b) by 480 days.

(21) Appl. No.: 14/265,697

(22) Filed: Apr. 30, 2014

(65) Prior Publication Data

US 2014/0353783 A1 Dec. 4, 2014

(30) Foreign Application Priority Data

May 30, 2013 (KR) .......................... 10-2013-0061973

(51) Int. Cl.
*H01L 43/08* (2006.01)
*G11B 5/39* (2006.01)

(52) U.S. Cl.
CPC ............ *H01L 43/08* (2013.01); *G11B 5/3909* (2013.01); *G11C 2213/54* (2013.01)

(58) Field of Classification Search
CPC ....... H01L 43/08; G11C 11/15; G11C 11/161; G11C 2213/54; G11B 5/3909

USPC .......................................................... 257/421
See application file for complete search history.

(56) References Cited

U.S. PATENT DOCUMENTS

| | | | |
|---|---|---|---|
| 6,608,738 B2 | 8/2003 | Sakakima et al. | |
| 6,831,312 B2 * | 12/2004 | Slaughter ............... | B82Y 10/00 257/295 |
| 7,449,345 B2 | 11/2008 | Horng et al. | |
| 7,595,520 B2 | 9/2009 | Horng et al. | |
| 7,920,361 B2 | 4/2011 | Yoshikawa et al. | |
| 7,986,498 B2 | 7/2011 | Wang et al. | |
| 8,184,407 B2 | 5/2012 | Ibusuki et al. | |
| 8,278,123 B2 | 10/2012 | Choi et al. | |
| 8,405,077 B2 | 3/2013 | Kim | |
| 2002/0036877 A1 | 3/2002 | Sakakima et al. | |
| 2005/0276099 A1 | 12/2005 | Horng et al. | |
| 2008/0023740 A1 | 1/2008 | Horng et al. | |
| 2008/0232003 A1 | 9/2008 | Ibusuki et al. | |
| 2008/0291585 A1 | 11/2008 | Yoshikawa et al. | |

(Continued)

*Primary Examiner* — Marcos D Pizarro
(74) *Attorney, Agent, or Firm* — Harness, Dickey & Pierce, PLC

(57) ABSTRACT

Magnetic memory devices include a magnetic tunnel junction including a free layer, a pinned layer, and a tunnel barrier layer between the free layer and the pinned layer. At least one of the free layer and the pinned layer includes a first vertical magnetic layer on the tunnel barrier layer and including boron (B), and a second vertical magnetic layer on the first vertical magnetic layer and having a lower B content than the first vertical magnetic layer. The first vertical magnetic layer is between the tunnel barrier layer and the second vertical magnetic layer, and a thickness of the second vertical magnetic layer is thinner than a thickness of the first vertical magnetic layer.

19 Claims, 8 Drawing Sheets

(56) References Cited

U.S. PATENT DOCUMENTS

| | | |
|---|---|---|
| 2009/0161266 A1 | 6/2009 | Wang et al. |
| 2010/0176471 A1 | 7/2010 | Zhu et al. |
| 2011/0084348 A1 | 4/2011 | Kuribayashi et al. |
| 2011/0233698 A1 | 9/2011 | Kim |
| 2011/0318848 A1 | 12/2011 | Choi et al. |
| 2012/0112298 A1 | 5/2012 | Kim et al. |
| 2012/0299133 A1 | 11/2012 | Son et al. |
| 2012/0300542 A1 | 11/2012 | Uchida et al. |
| 2013/0028013 A1 | 1/2013 | Ikeda et al. |
| 2013/0032910 A1 | 2/2013 | Jung et al. |
| 2014/0027869 A1* | 1/2014 | Lee .................. H01L 43/12 257/421 |
| 2014/0264663 A1* | 9/2014 | Chen et al. ............ H01L 43/08 257/421 |

* cited by examiner

MAGNETIC TUNNEL JUNCTION MEMORY DEVICES INCLUDING CRYSTALLIZED BORON-INCLUDING FIRST MAGNETIC LAYER ON A TUNNEL BARRIER LAYER AND LOWER BORON-CONTENT SECOND MAGNETIC LAYER ON THE FIRST MAGNETIC LAYER

CROSS-REFERENCE TO RELATED APPLICATIONS

This U.S. non-provisional patent application claims the benefit of priority under 35 U.S.C. §119 of Korean Patent Application No. 10-2013-0061973, filed on May 30, 2013, the entire content of which is hereby incorporated by reference.

BACKGROUND

Field

The present disclosure herein relates to semiconductor devices, and more particularly, to magnetic memory devices.

Related Art

As electronic devices become faster and/or consume less power, demands for a high speed and/or a low operating voltage of a semiconductor memory device included in an electronic device increase. In order to satisfy these demands, a magnetic memory device is suggested as the semiconductor memory device. Because the magnetic memory device has fast and/or nonvolatile characteristics, it is receiving great attention.

In general, the magnetic memory device may include a magnetic tunnel junction (MTJ) pattern. The MTJ pattern includes two magnetic materials and an insulating layer there between. According to the magnetization directions of the two magnetic materials, a resistance value of the MTJ pattern may vary. For example, when the magnetization directions of the two magnetic materials are antiparallel, the MTJ pattern may have a large resistance value, and when the magnetization directions of the two magnetic materials are parallel, the MTJ pattern may have a small resistance value. By using such a difference in resistance value, data may be written or read.

SUMMARY

The present disclosure herein relates to semiconductor devices, and more particularly, to magnetic memory devices.

The present disclosure provides magnetic memory devices having improved tunnel magnetic resistance.

Example embodiments of the inventive concepts provide magnetic memory devices including a magnetic tunnel junction. The magnetic tunnel junction includes a free layer, a pinned layer, and a tunnel barrier layer between the free layer and the pinned layer, wherein at least one of the free layer and the pinned layer includes a first vertical magnetic layer on the tunnel barrier layer and including boron (B), and a second vertical magnetic layer on the first vertical magnetic layer and having a lower B content than the first vertical magnetic layer. The first vertical magnetic layer is between the tunnel barrier layer and the second vertical magnetic layer and a thickness of the second vertical magnetic layer is thinner than a thickness of the first vertical magnetic layer.

In some example embodiments, a value multiplied by a saturation magnetization of the second vertical magnetic layer and the thickness of the second vertical magnetic layer may be less than a value multiplied by a saturation magnetization of the first vertical magnetic layer and the thickness of the first vertical magnetic layer.

In other example embodiments, the second vertical magnetic layer may include at least one of Fe, Co, Ni, Fe including a non-magnetic metal material, Co including the non-magnetic metal material, Ni including the non-magnetic metal material, and alloys thereof.

In still other example embodiments, the non-magnetic metal material may include at least one of Ta, Ti, Zr, Hf, B, and Cr.

In even other example embodiments, the devices may further include a non-magnetic metal layer between the first magnetic layer and the second vertical magnetic layer.

In yet other example embodiments, the non-magnetic metal layer may include at least one of Hf, Zr, Ti, Ta, and alloys thereof.

In further example embodiments, a thickness of the non-magnetic metal layer may be less than about 10 Å.

In still further example embodiments, the devices may further include a metal oxide layer on the second vertical magnetic layer, wherein the second vertical magnetic layer may be between the metal oxide layer and the tunnel barrier layer.

In even further example embodiments, the metal oxide layer may include at least one of a tantalum oxide, a magnesium oxide, a titanium oxide, a zirconium oxide, a hafnium oxide, and a zinc oxide.

In yet further example embodiments, a resistance of the metal oxide layer may be ⅓ less than a resistance of the tunnel barrier layer.

In yet further example embodiments, the magnetic tunnel junction may be on a substrate, and the pinned layer may be between the substrate and the tunnel barrier layer.

In yet further example embodiments, the magnetic tunnel junction may be on a substrate, and the free layer may be between the substrate and the tunnel barrier layer.

In yet further example embodiments, the pinned layer may include a third vertical magnetic layer on the tunnel barrier layer, a fourth vertical magnetic layer between the third vertical magnetic layer and the tunnel barrier layer, and an exchange coupled layer between the third vertical magnetic layer and the fourth vertical magnetic layer, wherein the fourth vertical magnetic layer may include the first vertical magnetic layer and the second vertical magnetic layer.

In yet further example embodiments, one side of the first vertical magnetic layer may contact one side of the tunnel barrier layer.

Other example embodiments provide a magnetic memory device including a magnetic tunnel junction including a free layer, a pinned layer, and a tunnel barrier layer between the free layer and the pinned layer. At least one of the free layer and the pinned layer includes a first magnetic layer on the tunnel barrier layer, and a second magnetic layer on the first magnetic layer. The first and second magnetic layers include boron. The first magnetic layer is crystallized. A magnetization direction of the first magnetic layer is parallel to a magnetization direction of the second magnetic layer. The first magnetic layer is between the tunnel barrier layer and the second magnetic layer, and a thickness of the second magnetic layer is thinner than a thickness of the first magnetic layer.

In some example embodiments, a magnetization direction of the free layer may be parallel or antiparallel to a magnetization direction of the pinned layer.

An atomic percentage of boron in the first magnetic layer may be about 20 at %.

The second magnetic layer may have a lower boron content than the first magnetic layer.

The free layer may include the first and second magnetic layers, and the pinned layer may include a third magnetic layer on the tunnel barrier layer, and a fourth magnetic layer on the first magnetic layer. The third and fourth magnetic layers may include boron. The third magnetic layer may be crystallized. The third magnetic layer may be between the tunnel barrier layer and the forth magnetic layer.

The pinned layer may include the first and second magnetic layers, and the magnetization direction of the first magnetic layer may be parallel to the magnetization direction of the second magnetic layer.

BRIEF DESCRIPTION OF THE DRAWINGS

Example embodiments will be more clearly understood from the following detailed description taken in conjunction with the accompanying drawings.

FIG. 1 is a circuit diagram illustrating a unit memory cell of a magnetic memory device according to example embodiments of the inventive concepts;

FIG. 2 is a sectional view illustrating a magnetic memory device according to some example embodiments of the inventive concepts;

FIG. 3 is a sectional view illustrating a modification of a magnetic memory device according to further example embodiments of the inventive concepts;

FIG. 4 is a sectional view illustrating a magnetic memory device according to other example embodiments of the inventive concepts;

FIG. 5 is a sectional view illustrating a modification of a magnetic memory device according to yet other example embodiments of the inventive concepts;

FIG. 6 is a sectional view illustrating a magnetic memory device according to yet further example embodiments of the inventive concepts;

FIG. 7 is a sectional view illustrating a modification of a magnetic memory device according to still other example embodiments of the inventive concepts; and FIGS. 8 and 9 are views illustrating electronic devices including a semiconductor device according to example embodiments of the inventive concepts.

DETAILED DESCRIPTION OF EXAMPLE EMBODIMENTS

Figure 1:
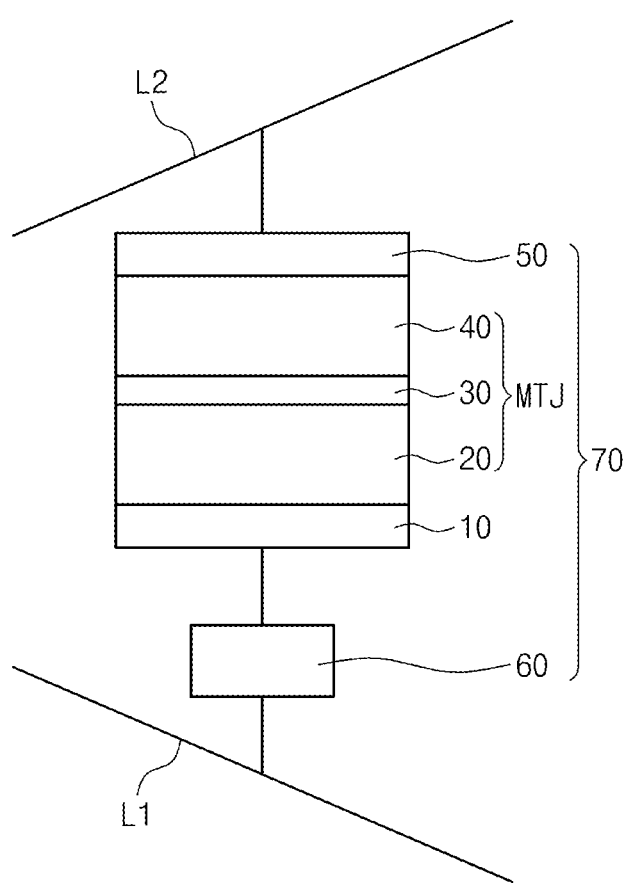
FIGS. 1-9 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular foil is "a," "an" and "the" are intended to include the plural foil is as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

The present disclosure herein relates to semiconductor devices, and more particularly, to magnetic memory devices.

FIG. 1 is a circuit diagram illustrating a unit memory cell of a magnetic memory device according to example embodiments of the inventive concepts.

Referring to FIG. 1, a unit memory cell 70 is disposed between a first wire L1 and a second wire L2 intersecting each other and connects them. The unit memory cell 70 may include a switching device 60, a magnetic tunnel junction (MTJ), a first conductive structure 10, and a second conductive structure 50. The switching device 60, the first conductive structure 10, the MTJ, and the second conductive structure 50 may be electrically connected in series. One of the first and second wires L1 and L2 is used as a word line and the other is used as a bit line.

The switching device 60 may be configured to selectively control a flow of charge passing through the MTJ. For example, the switching device 60 may be one of a diode, a pnp bipolar transistor, an npn bipolar transistor, an nMOS field effect transistor, and a pMOS field effect transistor. When the switching device 60 includes a bipolar transistor or an MOS field effect transistor, i.e., a three-terminal device, an additional wire (not shown) may be connected to the switching device 60.

The MTJ may include a first magnetic structure 20, a second magnetic structure 40, and a tunnel barrier 30 there between. Each of the first and second magnetic structures 20 and 40 may include at least one magnetic layer formed of magnetic material. The first conductive structure 10 may be interposed between the first magnetic structure 20 and the switching device 60, and the second conductive structure 50 may be interposed between the second magnetic structure 40 and the second wire L2.

A magnetization direction of one of a magnetic layer of the first magnetic structure 20 and a magnetic layer of the second magnetic structure 40 may be pinned under a normal operating environment regardless of external magnetic field. A magnetic layer having fixed magnetic characteristic is defined as a pinned layer. On the contrary, a magnetization direction of the other of the magnetic layer of the first magnetic structure 20 and the magnetic layer of the second magnetic structure 40 may be switched by an external magnetic field applied thereto. A magnetic layer having variable magnetic characteristic is defined as a free layer. The MTJ may include at least one free layer and at least one pinned layer, separated from the tunnel barrier 30.

An electrical resistance of the MTJ may depend on magnetization directions of the free layer and the pinned layer. For example, the electrical resistance of the MTJ may be much larger when the magnetization directions of the free layer and the pinned layer are antiparallel, compared to when they are parallel. As a result, the electrical resistance of the MTJ may be adjusted by changing the magnetization direction of the free layer, and this is used as a data storage principle in a magnetic memory device according to example embodiments of the inventive concepts.

Figure 2:
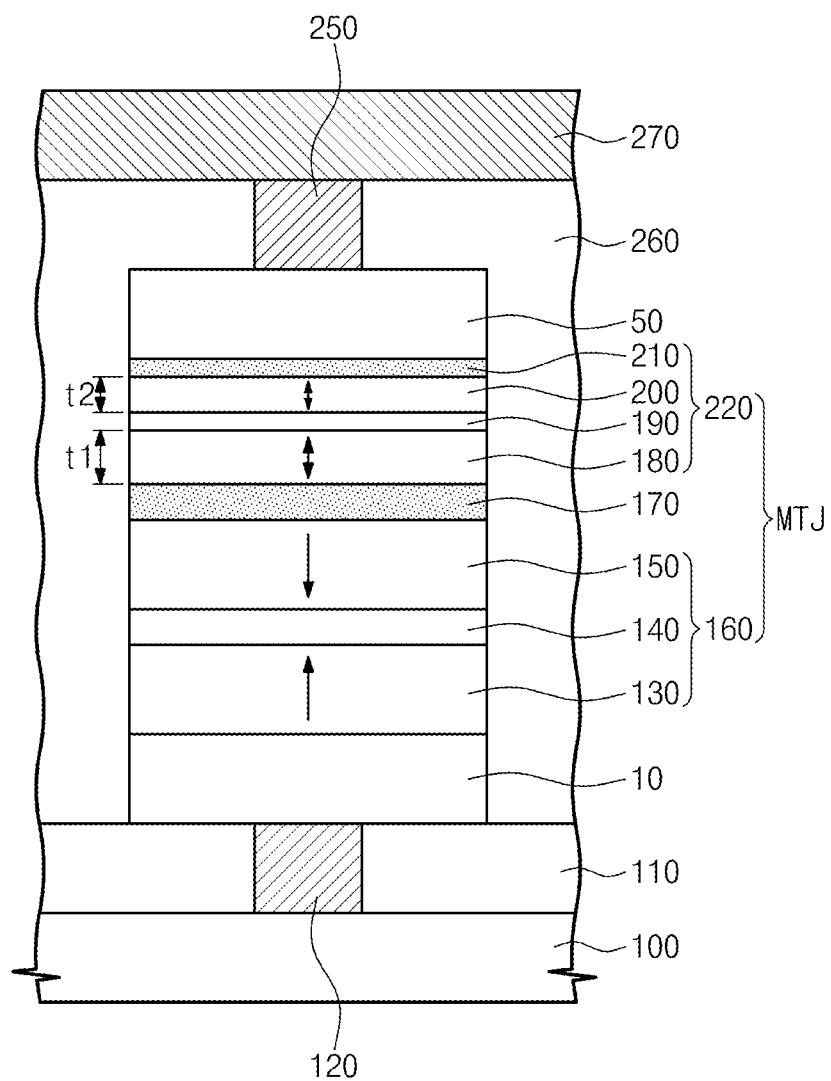

FIG. 2 is a sectional view illustrating a magnetic memory device according to some example embodiments of the inventive concepts.

Referring to FIG. 2, a first dielectric layer 110 may be disposed on a substrate 100, and a lower contact plug 120 may penetrate the first dielectric layer 110. The bottom surface of the lower contact plug 120 may be electrically connected to one terminal of a switching device. The substrate 100 may be one of materials having semiconductor characteristics, insulating materials, and a semiconductor or a conductor covered by an insulation material. For example, the substrate 100 may be a silicon wafer. The first dielectric layer 110 may include an oxide, a nitride, and/or an oxynitride. The lower contact plug 120 may include a conductive material. For example, the conductive material may be at least one of a semiconductor doped with a dopant (e.g., doped silicon, doped germanium, doped silicon-germanium, etc.), a metal (e.g., titanium, tantalum, tungsten, etc.), and a conductive metal nitride (e.g., nitride titanium, nitride tantalum, etc.).

A first conductive structure 10, a pinned layer 160, a tunnel barrier layer 170, a free layer 220, and a second conductive structure 50 may be sequentially stacked on the first dielectric layer 110. The first conductive structure 10 may be electrically connected to the top surface of the lower contact plug 120. The pinned layer 160, the tunnel barrier layer 170, and the free layer 220 may be included in an MTJ. The first conductive structure 10, the MTJ, and the second conductive structure 50 may have sidewalls aligned with each other. For example, the sidewalls of the first conductive structure 10, the MTJ, and the second conductive structures 50 may have a sloped profile.

The pinned layer 160 may include a first vertical magnetic layer 130 on the first conductive structure 10, a second vertical magnetic layer 150 on the first vertical magnetic layer 130, and an exchange coupled layer 140 between the first vertical magnetic layer 130 and the second vertical magnetic layer 150. In more detail, the first vertical magnetic layer 130 may be disposed between the first conductive structure 10 and the exchange coupled layer 140, and the second vertical magnetic layer 150 may be disposed between the exchange coupled layer 140 and the tunnel barrier layer 170.

The free layer 220 may include a third vertical magnetic layer 180 on the tunnel barrier layer 170, a fourth vertical magnetic layer 200 on the third vertical magnetic layer 180, a first layer 190 between the third vertical magnetic layer 180 and the fourth vertical magnetic layer 200, and a second layer 210 between the fourth vertical magnetic layer 200 and the second conductive structure 50. In more detail, the third vertical magnetic layer 180 may be disposed between the tunnel barrier layer 170 and the first layer 190, and the fourth vertical magnetic layer 200 may be disposed between the first layer 190 and the second layer 210.

The pinned layer 160 may have a magnetization direction that is substantially vertical to the top surface of the substrate 100. In the same manner, the magnetization direction of the free layer 220 may be substantially vertical to the top surface of the substrate 100.

In more detail, the first vertical magnetic layer 130 may have a magnetic easy axis that is substantially vertical to the top surface of the substrate 100. Accordingly, the first vertical magnetic layer 130 may have a magnetization direction that is substantially vertical to the top surface of the substrate 100. The magnetization direction of the first vertical magnetic layer 130 may be pinned in one direction. In the same manner, the second vertical magnetic layer 150 may have a magnetic easy axis that is substantially vertical to the top surface of the substrate 100. Accordingly, the second vertical magnetic layer 150 may have a magnetization direction that is substantially vertical to the top surface of the substrate 100. The magnetization direction of the second vertical magnetic layer 150 may be pinned antiparallel to the magnetization direction of the first vertical magnetic layer 130 by the exchange coupled layer 140. By a program operation, the magnetization direction of the third vertical magnetic layer 180 may be changed to be parallel or antiparallel to the magnetization direction of the second vertical magnetic layer 150. The fourth vertical magnetic layer 200 may be coupled to the third vertical magnetic layer 180 by the first layer 190, and accordingly, the magnetization direction of the fourth vertical magnetic layer 200 may be changed to be parallel to the magnetization direction of the third vertical magnetic layer 180.

The first conductive structure 10 may include a seed layer for forming the MTJ and may serves as an electrode to electrically connect the switching device and the MTJ. According to example embodiments of the inventive concepts, the first conductive structure 10 may include a sequentially stacked first conductive layer and second conductive layer. For example, the first conductive layer may include Ta or CoHf, and the second conductive layer may include Ru. The second conductive structure may include a capping layer covering the MTJ, and may serve as an electrode electrically connecting the MTJ and a wire 270. The second conductive structure 50 may include a single layer or multilayer structure including at least one of precious metal layers, magnetic alloy layers, and metal layers. For example, the precious metal layer may include at least one of Ru, Pt, Pd, Rh, and Ir, and the magnetic alloy layer may include at least one of Co, Fe, and Ni, and the metal layer may include at least one of Ta and Ti. However, the above materials are exemplarily used to understand the technical ideas of the inventive concepts better, and example embodiments of the inventive concepts are not limited thereto.

The first vertical magnetic layer 130 may include a vertical magnetic material. For example, the first vertical magnetic layer 130 may include a) CoFeTv where a content ratio of Tb is equal to or greater than 10%, b) CoFeGd where a content ratio of Gd is equal to or greater than 10%, c) CoFeDy, d) FePt in a $L1_0$ structure, e) FePd in a $L1_0$ structure, f) CoPd in a $L1_0$ structure, g) CoPt in a $L1_0$ structure, h) CoPt in a hexagonal close packed lattice, and i) alloys formed of at least one of a) to h). Additionally, the first vertical magnetic layer 130 may have a structure in which the magnetic layers and nonmagnetic layers are alternately and repeatedly stacked, such as (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (n is the number of stacking).

The exchange coupled layer 140 may include at least one of Ru, Ir, and Rh. The exchange coupled layer 140 may combine the first vertical magnetic layer 130 and the second vertical magnetic layer 150 antiferromagnetically. By the exchange coupled layer 140, the second vertical magnetic layer 150 may have a vertical magnetization antiparallel to the magnetization direction of the first vertical magnetic layer 130.

The second vertical magnetic layer 150 may have a single layer or multilayer structure including at least one of CoFeB, CoFeBTa, CoHf, Co, and CoZr. In more detail, the second vertical magnetic layer 150 may have a multilayer structure including a Co layer and a CoHf layer or a multi layer structure including a CoFeBTa layer and a CoFeB layer.

The tunnel barrier layer 170 may be formed of a dielectric material. For example, the tunnel barrier layer 170 may be formed of MgO and/or AlO.

The third vertical magnetic layer 180 may include B. For example, the third vertical magnetic layer 180 may include CoFeB. The third vertical magnetic layer 180 is crystallized through an annealing process, so it may have the tunneling magnetic resistance (TMR) characteristic of the MTJ.

The first layer 190 may include a non-magnetic metal material. The non-magnetic metal material includes at least one of Hf, Zr, Ti, Ta, and alloys thereof. By the first layer 190, the fourth vertical magnetic layer 200 may be coupled to the third vertical magnetic layer 180. Accordingly, the fourth vertical magnetic layer 200 may have a vertical magnetization parallel to the magnetization direction of the third vertical magnetic layer 180. The first layer 190 may have a thickness of less than about 10 Å. However, according to other example of the inventive concepts, the first layer 190 may be omitted.

The fourth vertical magnetic layer 200 may have a smaller B content than the third vertical magnetic layer 180. An atomic percent (at %) of B in the fourth vertical magnetic layer 200 may be lower than that in the third vertical magnetic layer 180. For example, a B content of the third vertical magnetic layer 180 may be about 20 at %, and a B content of the fourth vertical magnetic layer 200 may be less than about 20 at % According to example embodiments of the inventive concepts, a B content of the fourth vertical magnetic layer 200 may be 0 at %. The fourth vertical magnetic layer 200 may include at least one of i) Fe, Co, Ni, and alloys thereof and ii) Fe, Co, Ni further including a non-magnetic metal material, and alloys thereof. The non-magnetic metal material may be at least one of Ta, Ti, Zr, Hf, B, and Cr. According to example embodiments of the inventive concepts, the fourth vertical magnetic layer 200 may include Fe or Fe alloys. According to example embodiments of the inventive concepts, the fourth vertical magnetic layer 200 may be formed of Fe, Co, or Ni including the non-magnetic metal material. A value multiplied by a saturation magnetization $M_{s2}$ of the fourth vertical magnetic layer 200 and a thickness t2 of the fourth vertical magnetic layer 200 may be less than a value multiplied by a saturation magnetization $M_{s1}$ of the third vertical magnetic layer 180 and a thickness t1 of the third vertical magnetic layer 180. The thickness t2 of the fourth vertical magnetic layer 200 may be thinner than the thickness t1 of the third vertical magnetic layer 180.

The third vertical magnetic layer 180 may have an amorphous structure. However, due to an annealing process, B in the third vertical magnetic layer 180 may spread into the first layer 190 and the fourth vertical magnetic layer 200 having a relatively small B content. Accordingly, the third vertical magnetic layer 180 may be crystallized. Because the third vertical magnetic layer 180 is crystallized, the TMR characteristic of the MTJ may appear at the boundary between the tunnel barrier layer 170 and the third vertical magnetic layer 180.

According to example embodiments of the inventive concepts, the free layer 220 may include the third and fourth vertical magnetic layers 180 and 200 having different B contents. Due to an annealing process, the B in the third vertical magnetic layer 180 may easily spread into the fourth vertical magnetic layer 200 having a relatively low B concentration. Accordingly, even when the annealing process is performed at a low temperature (e.g., below about 300° C.), due to a B concentration difference between magnetic layers 180 and 200, as the B in the third vertical magnetic layer 180 easily spreads into the fourth magnetic layer 200, the TMR of the MTJ may be increased.

The second layer 210 may include a metal oxide. The second layer 210 may include at least one of a tantalum oxide, a magnesium oxide, a titanium oxide, a zirconium oxide, a hafnium oxide, and a zinc oxide. The second layer 210 may help the fourth vertical magnetic layer 200 to have a magnetization vertical to the top surface of the substrate 100. A resistance of the second layer 210 may be less than a value that is ⅓ of a resistance of the tunnel barrier layer 180.

A second dielectric layer 260 is disposed on the front surface of the substrate 100 to cover the first conductive structure 10, the MTJ, and the second conductive structure 50. An upper contact plug 250 penetrates the second dielectric layer 260 to connect to the second conductive structure 50. The second dielectric layer 260 may include an oxide, a nitride and/or an oxynitride, and the upper contact plug 250 may include at least one of metals such as Ti, Ta, Cu, Al, and W and conductive metal nitrides such as nitride titanium and nitride tantalum. A wire 270 may be disposed on the second dielectric layer 260. The wire 270 may contact the upper contact plug 250. The wire 270 may include at least one of metals such as Ti, Ta, Cu, Al, and W and conductive metal nitrides such as nitride titanium and nitride tantalum. According to example embodiments of the inventive concepts, the wire 270 may be a bit line.

Figure 3:
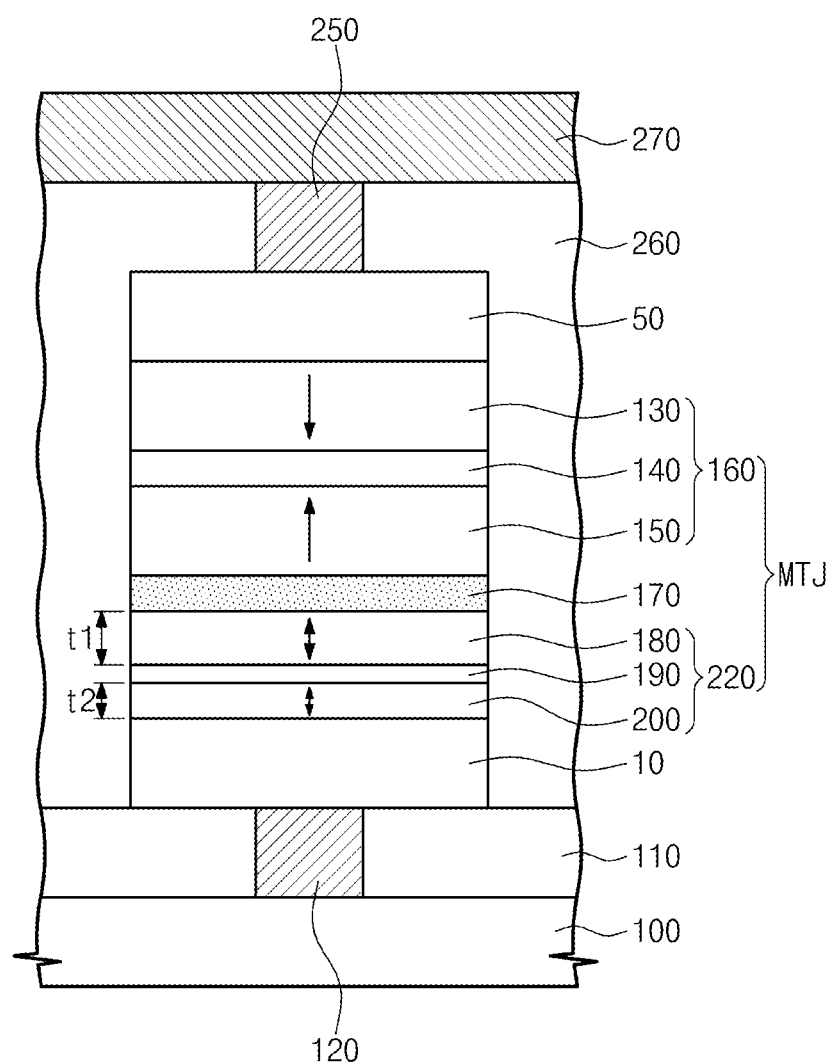

FIG. 3 is a sectional view illustrating a modification of a magnetic memory device according to further example embodiments of the inventive concepts.

Like reference numbers refer to like elements in the same configuration of the magnetic memory device of FIG. 2 according to example embodiments of the inventive concepts, and for convenience of description, overlapping descriptions are omitted.

Referring to FIG. 3, a first dielectric layer 110 disposed on a substrate 100, and a first conductive structure 10, a free layer 220, a tunnel barrier layer 170, a pinned layer 160, and a second conductive structure 50 may be sequentially stacked on the first dielectric layer 110. That is, unlike the magnetic memory device described with reference to FIG. 2, the free layer 220 may be interposed between the tunnel barrier layer 170 and the first conductive structure 10, and the pinned layer 160 may be interposed between the tunnel barrier layer 170 and the second conductive structure 50.

The pinned layer 160 may include a first vertical magnetic layer 130 on the tunnel barrier layer 170, a second vertical magnetic layer 150 between the first vertical magnetic layer 130 and the tunnel barrier layer 170, and an exchange coupled layer 140 between the first vertical magnetic layer 130 and the second vertical magnetic layer 150. In more detail, the first vertical magnetic layer 130 may be disposed between the second conductive structure 50 and the exchange coupled layer 140, and the second vertical magnetic layer 150 may be disposed between the exchange coupled layer 140 and the tunnel barrier layer 170.

The free layer 220 may include a third vertical magnetic layer 180 between the first conductive structure 10 and the tunnel barrier layer 170, a fourth vertical magnetic layer 200 between the third vertical magnetic layer 180 and the first conductive structure 10, and a first layer 190 between the third vertical magnetic layer 180 and the fourth vertical magnetic layer 200. However, according to other example embodiments of the inventive concepts, the first layer 190 may be omitted.

The third vertical magnetic layer 180 may include B, and the fourth vertical magnetic layer 200 may have a lower B content than the third vertical magnetic layer 180. That is, an atomic percentage (at %) of B in the fourth vertical magnetic layer 200 may be lower than that in the third vertical magnetic layer 180. According to example embodiments of the inventive concepts, the fourth vertical magnetic layer 200 may include Co or Co alloys. A value multiplied by a saturation magnetization $M_{s2}$ of the fourth vertical magnetic layer 200 and a thickness t2 of the fourth vertical magnetic layer 200 may be less than a value multiplied by a saturation magnetization $M_{s1}$ of the third vertical magnetic layer 180 and a thickness t1 of the third vertical magnetic layer 180. The thickness t2 of the fourth vertical magnetic layer 200 may be thinner than the thickness t1 of the third vertical magnetic layer 180.

Figure 4:
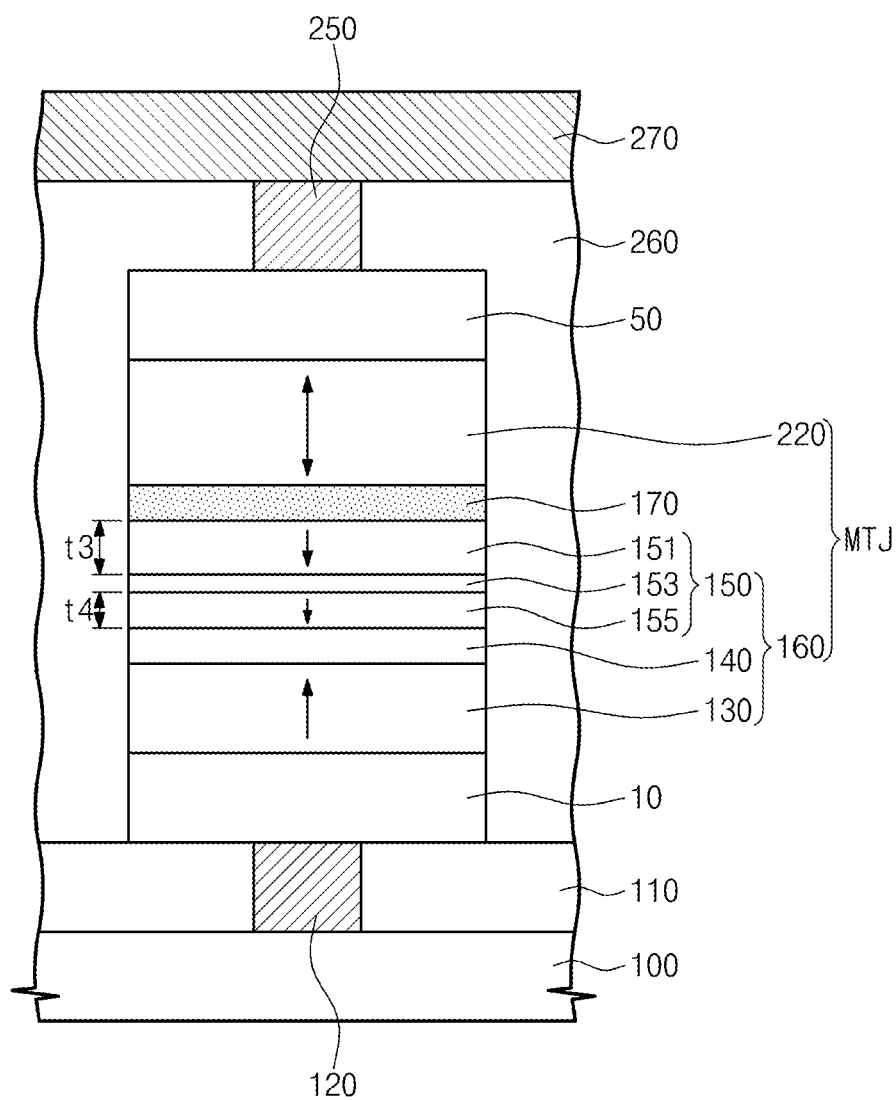

FIG. 4 is a sectional view illustrating a magnetic memory device according to other example embodiments of the inventive concepts.

Like reference numbers refer to like elements in the same configuration of the magnetic memory device of FIG. 2 according to example embodiments of the inventive concepts, and for convenience of description, overlapping descriptions are omitted.

Referring to FIG. 4, an MTJ including a sequentially-stacked pinned layer 160, tunnel barrier layer 170, and free layer 220 may be disposed on a substrate 100.

The pinned layer 160 may include a first vertical magnetic layer 130 on a first conductive structure 10, a second vertical magnetic layer 150 on the first vertical magnetic layer 130, and an exchange coupled layer 140 between the first vertical magnetic layer 130 and the second vertical magnetic layer 150, which are sequentially stacked on a substrate 100. In more detail, the first vertical magnetic layer 130 may be disposed between the first conductive structure 10 and the exchange coupled layer 140, and the second vertical magnetic layer 150 may be disposed between the exchange coupled layer 140 and the tunnel barrier layer 170.

The second vertical magnetic layer 150 may include a first sub magnetic layer 151 between the exchange coupled layer 140 and the tunnel barrier layer 170, a second sub magnetic layer 155 between the first sub magnetic layer 151 and the exchange coupled layer 140, and a sub layer 153 between the first sub magnetic layer 151 and the second sub magnetic layer 155.

The first vertical magnetic layer 130 may have a magnetization direction that is substantially vertical to the top surface of the substrate 100 and pinned in one direction. In the same manner, the second vertical magnetic layer 155 may have a magnetization direction that is substantially vertical to the top surface of the substrate 100 and pinned in one direction. Due to the exchange coupled layer 140, the magnetization direction of the second sub magnetic layer 155 may be pinned antiparallel to the magnetization direction of the first vertical magnetic layer 130. The first sub magnetic layer 151 may be coupled to the second sub magnetic layer 155 through the sub layer 153, and accordingly, a magnetization direction of the first sub magnetic layer 151 may be pinned parallel to that of the second sub magnetic layer 155.

The first sub magnetic layer 151 may include B. For example, the first sub magnetic layer 151 may include CoFeB. The first sub magnetic layer 151 is crystallized through an annealing process, so it may have the TMR characteristic of the MTJ.

The sub layer 153 may include a non-magnetic metal material. The non-magnetic metal material includes at least one of Hf, Zr, Ti, Ta, and alloys thereof. By the sub layer 153, the first sub magnetic layer 151 may be coupled to the second sub magnetic layer 155. Accordingly, the first sub magnetic layer 151 may have a vertical magnetization parallel to the magnetization direction of the second sub magnetic layer 155. The sub layer 153 may have a thickness of less than about 10 Å. However, according to other example embodiments of the inventive concepts, the sub layer 153 may be omitted.

The second sub magnetic layer 155 may have a smaller B content than the first sub magnetic layer 151. That is, an at % of B in the second sub magnetic layer 155 may be lower than that in the first sub magnetic layer 151. For example, a B content of the first sub magnetic layer 151 may be about 20 at %, and a B content of the second sub magnetic layer 155 may be less than about 20 at %. According to example embodiments of the inventive concepts, a B content of the second sub magnetic layer 155 may be 0 at %. The second sub magnetic layer 155 may include at least one of i) Fe, Co, Ni, and alloys thereof and Fe, Co, Ni further including a non-magnetic metal material, and alloys thereof. According to other example embodiments of the inventive concepts, the second sub magnetic layer 155 may be Co or Co alloys. A value multiplied by a saturation magnetization $M_{s4}$ of the second sub magnetic layer 155 and a thickness t4 of the second sub magnetic layer 155 may be less than a value multiplied by a saturation magnetization $M_{s3}$ of the first sub magnetic layer 151 and a thickness t3 of the first sub magnetic layer 151. The thickness t4 of the second sub magnetic layer 155 may be thinner than the thickness t3 of the first sub magnetic layer 151.

The first sub magnetic layer 151 may have an amorphous structure. However, due to an annealing process, B in the first sub magnetic layer 151 may spread into the sub layer 153 and the second sub magnetic layer 155 having a relatively small B content. Accordingly, the first sub magnetic layer 151 may be crystallized. Because the first sub magnetic layer 151 is crystallized, the TMR characteristic of the MTJ may appear.

According to other example embodiments of the inventive concepts, the pinned layer 160 may include the first and second sub magnetic layers 151 and 155 having different B contents. Due to an annealing process, the B in the first sub magnetic layer 151 may easily spread into the second sub magnetic layer 155 having a relatively low B concentration. Accordingly, even when the annealing process is performed at a low temperature (e.g., below about 300° C.), due to a B concentration difference between magnetic layers 151 and 155, as the B in the first sub magnetic layer 151 easily spreads into the second sub magnetic layer 155, the TMR of the MTJ may be increased.

The free layer 220 may have a single layer or multilayer structure including at least one of Co, Fe, Ni, and alloys thereof. For example, the free layer 220 may have a single layer or multilayer structure including at least one of Fe, Co, Ni, CoFe, NiFe, NiFeB, CoFeB, CoFeBTa, CoHf, and CoZr.

Figure 5:
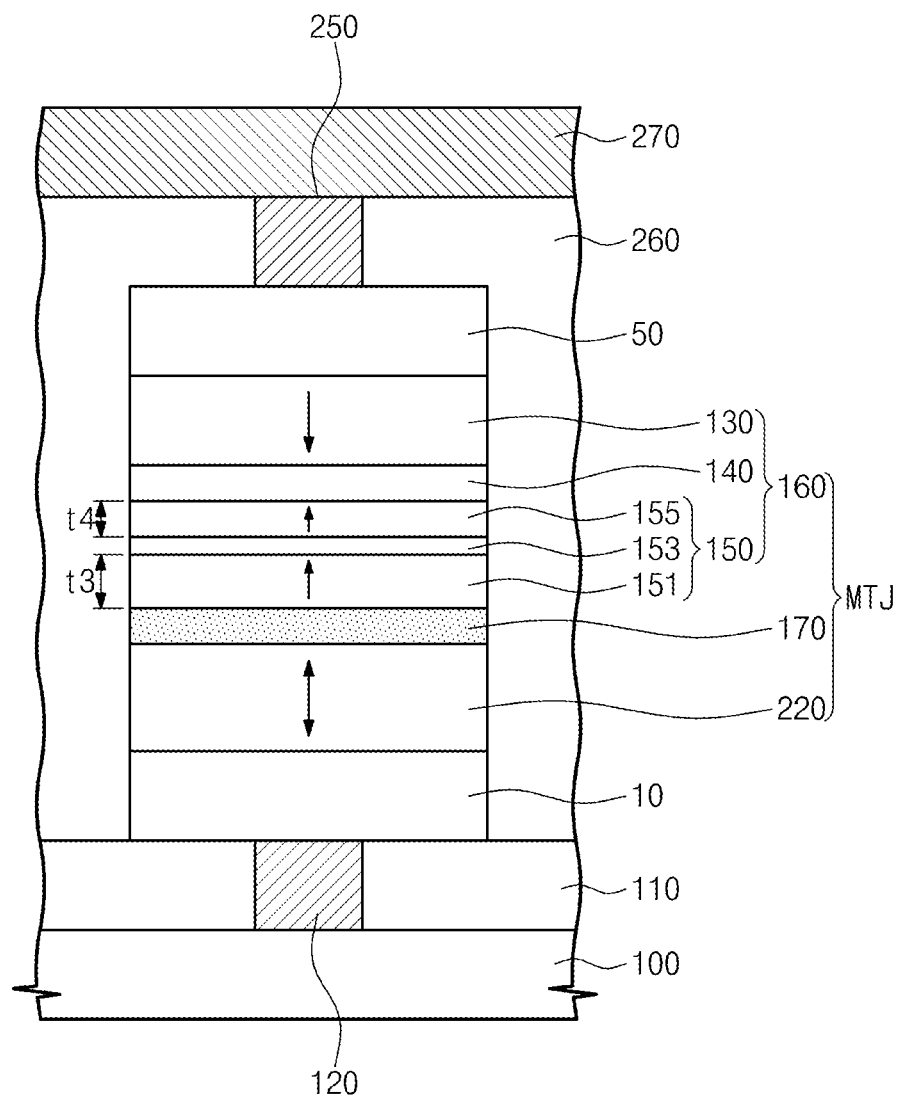

FIG. 5 is a sectional view illustrating a modification of a magnetic memory device according to yet other example embodiments of the inventive concepts.

Like reference numbers refer to like elements in the same configuration of the magnetic memory device of FIG. 4 according to example embodiments of the inventive concepts, and for convenience of description, overlapping descriptions are omitted.

Referring to FIG. 5, an MTJ including a sequentially-stacked free layer 220, tunnel barrier layer 170, and pinned layer 160 may be displayed on a substrate 100. That is, unlike the semiconductor memory device described with reference to FIG. 4, the free layer 220 may be interposed between the tunnel barrier layer 170 and the first conductive structure 10, and the pinned layer 160 may be disposed between the tunnel barrier layer 170 and the second conductive structure 50.

The pinned layer 160 may include a first vertical magnetic layer 130 on the tunnel barrier layer 170, a second vertical magnetic layer 150 between the first magnetic layer 130 and the tunnel barrier layer 170, and an exchange coupled layer 140 between the first vertical magnetic layer 130 and the second vertical magnetic layer 150. In more detail, the first vertical magnetic layer 130 may be disposed between the second conductive structure 50 and the exchange coupled layer 140, and the second vertical magnetic layer 150 may be disposed between the exchange coupled layer 140 and the tunnel barrier layer 170.

The second vertical magnetic layer 150 may include a first sub magnetic layer 151 between the exchange coupled layer 140 and the tunnel barrier layer 170, a second sub magnetic layer 155 between the first sub magnetic layer 151 and the exchange coupled layer 140, and a sub layer 153 between the first sub magnetic layer 151 and the second sub magnetic layer 155. However, according to other example embodiments, the sub layer 153 may be omitted.

The first sub magnetic layer 151 may include B, and the second sub magnetic layer 155 may have a lower B content than the first sub magnetic layer 151. That is, an at % of B in the second sub magnetic layer 155 may be lower than that in the first sub magnetic layer 151. According to other example embodiments of the inventive concepts, the second sub magnetic layer 155 may include Fe or Fe alloys. A value multiplied by a saturation magnetization $M_{s4}$ of the second sub magnetic layer 155 and a thickness t4 of the second sub magnetic layer 155 may be less than a value multiplied by a saturation magnetization $M_{s3}$ of the first sub magnetic layer 151 and a thickness t3 of the first sub magnetic layer 151. The thickness t4 of the second sub magnetic layer 155 may be thinner than the thickness t3 of the first sub magnetic layer 151.

Figure 6:
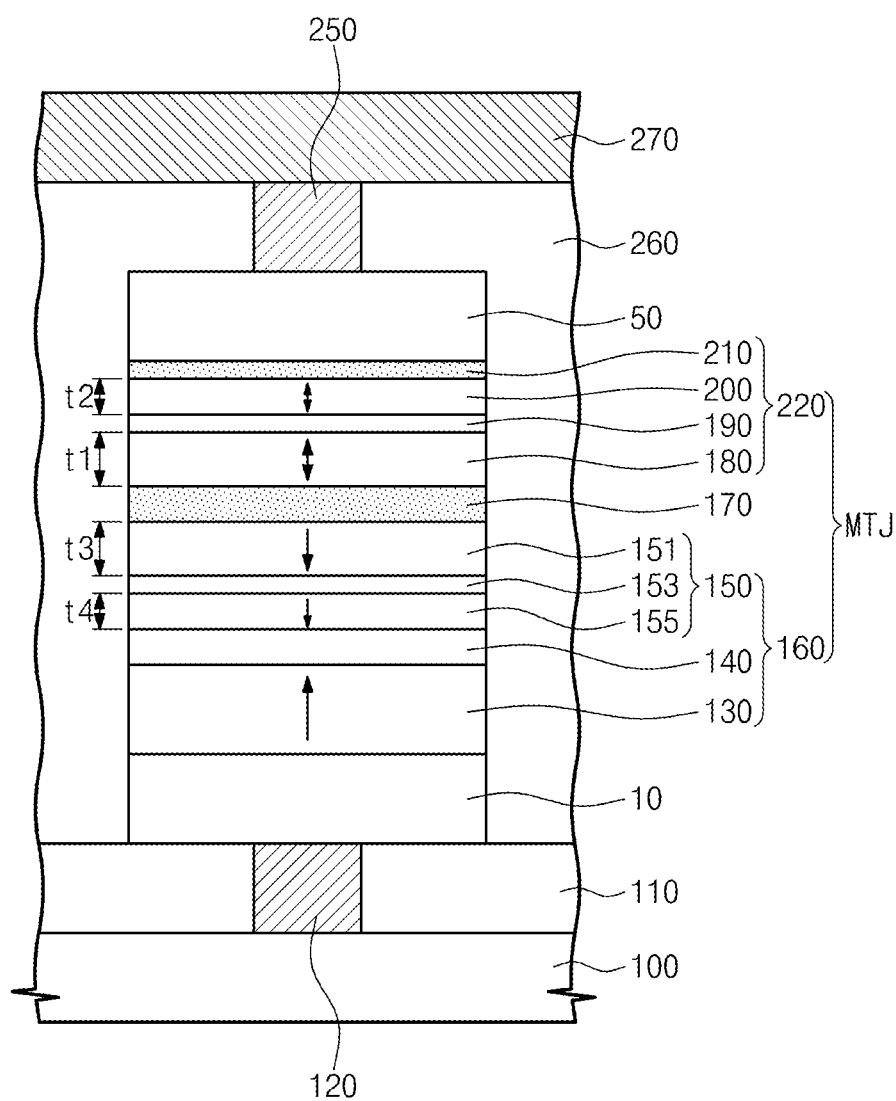

FIG. 6 is a sectional view illustrating a magnetic memory device according to yet further example embodiments of the inventive concepts.

Like reference numbers refer to like elements in the same configuration of the magnetic memory device of FIGS. 2 and 4 according to example embodiments of the inventive concepts, and for convenience of description, overlapping descriptions are omitted.

Referring to FIG. 6, a MTJ including a sequentially-stacked pinned layer 160, tunnel barrier layer 170, and free layer 220 may be disposed on a substrate 100.

The pinned layer 160 may include a first vertical magnetic layer 130 on a first conductive structure 10, a second vertical magnetic layer 150 on the first vertical magnetic layer 130, and an exchange coupled layer 140 between the first vertical magnetic layer 130 and the second vertical magnetic layer 150, which are sequentially stacked on a substrate 100. The second vertical magnetic layer 150 may include a first sub magnetic layer 151 between the exchange coupled layer 140 and the tunnel barrier layer 170, a second sub magnetic layer 155 between the first sub magnetic layer 151 and the exchange coupled layer 140, and a sub layer 153 between the first sub magnetic layer 151 and the second sub magnetic layer 155.

The free layer 220 may include a third vertical magnetic layer 180 on the tunnel barrier layer 170, a fourth vertical magnetic layer 200 on the third vertical magnetic layer 180, a first layer 190 between the third vertical magnetic layer 180 and the fourth vertical magnetic layer 200, and a second layer 210 between the fourth vertical magnetic layer 200 and the second conductive structure 50.

The third vertical magnetic layer 180 may include B. For example, the third vertical magnetic layer 180 may include CoFeB. The first layer 190 may include a non-magnetic metal material. The non-magnetic material may include at least one of Hf, Zr, Ti, Ta, and alloys thereof. However, according to other example embodiments of the inventive concepts, the first layer 190 may be omitted. The fourth vertical magnetic layer 200 may have a smaller B content than the third vertical magnetic layer 180. An at % of B in the fourth vertical magnetic layer 200 may be lower than that in the third vertical magnetic layer 180. The fourth vertical magnetic layer 200 may include at least one of i) Fe, Co, Ni, and alloys thereof, and ii) Fe, Co, Ni further including a non-magnetic metal material, and alloys thereof. The non-magnetic metal material may be at least one of Ta, Ti, Zr, Hf, B, and Cr. According to other example embodiments of the inventive concepts, the fourth vertical magnetic layer 200 may include Fe or Fe alloys. A value multiplied by a saturation magnetization $M_{s2}$ of the fourth vertical magnetic layer 200 and a thickness t2 of the fourth vertical magnetic layer 200 may be less than a value multiplied by a saturation magnetization $M_{s1}$ of the third vertical magnetic layer 180 and a thickness t1 of the third vertical magnetic layer 180. The thickness t2 of the fourth vertical magnetic layer 200 may be thinner than the thickness t1 of the third vertical magnetic layer 180.

The third vertical magnetic layer 180 may have an amorphous structure. However, due to an annealing process, B in the third vertical magnetic layer 180 may spread into the first layer 190 and the fourth vertical magnetic layer 200 having a relatively small B content. Accordingly, the third vertical magnetic layer 180 may be crystallized. Because the third vertical magnetic layer 180 is crystallized, the TMR characteristic of the MTJ may appear at the boundary between the tunnel barrier layer 170 and the third vertical magnetic layer 180.

The first sub magnetic layer 151 may include B. For example, the first sub magnetic layer 151 may include CoFeB. The sub layer 153 may include a non-magnetic metal material. The non-magnetic metal material includes at least one of Hf, Zr, Ti, Ta, and alloys thereof. According to another embodiment of the inventive concepts, the sub layer 153 may be omitted. The second sub magnetic layer 155 may have a smaller B content than the first sub magnetic layer 151. That is, an at % of B in the second sub magnetic layer 155 may be lower than that in the first sub magnetic layer 151. The second sub magnetic layer 155 may include at least one of i) Fe, Co, Ni, and alloys thereof, and ii) Fe, Co, Ni further including a non-magnetic metal material, and alloys thereof. For example, the non-magnetic metal materials may be at least one of Ta, Ti, Zr, Hf, B, and Cr. According to other example embodiments of the inventive concepts, the second sub magnetic layer 155 may be Co or Co alloys. A value multiplied by a saturation magnetization $M_{s4}$ of the second sub magnetic layer 155 and a thickness t4 of the second sub magnetic layer 155 may be less than a value multiplied by a saturation magnetization $M_{s3}$ of the first sub magnetic layer 151 and a thickness t3 of the first sub magnetic layer 151. The thickness t4 of the second sub magnetic layer 155 may be thinner than the thickness t3 of the first sub magnetic layer 151.

The first sub magnetic layer 151 may have an amorphous structure. However, due to an annealing process, B in the first sub magnetic layer 151 may spread into the sub layer 153 and the second sub magnetic layer 155 having a relatively small B content. Accordingly, the first sub magnetic layer 151 may be crystallized. Because the first sub magnetic layer 151 is crystallized, the TMR characteristic of the MTJ may appear.

According to other example embodiments of the inventive concepts, the free layer 220 and the pinned layer 160 may include magnetic layers having different B contents. Due to an annealing process, the B in the third vertical magnetic layer 180 and the first sub magnetic layer 151 may easily spread into the fourth vertical magnetic layer 200 and the second sub magnetic layer 155 having a relatively low B concentration, respectively. Accordingly, even when the annealing process is performed at a low temperature (e.g., below about 300° C.), due to a B concentration difference between magnetic layers, as the B in the third vertical magnetic layer 180 and the first sub magnetic layer 151 may easily spread into the fourth vertical magnetic layer 200 and the second sub magnetic layer 155, respectively, the TMR of the MTJ may be increased.

Figure 7:
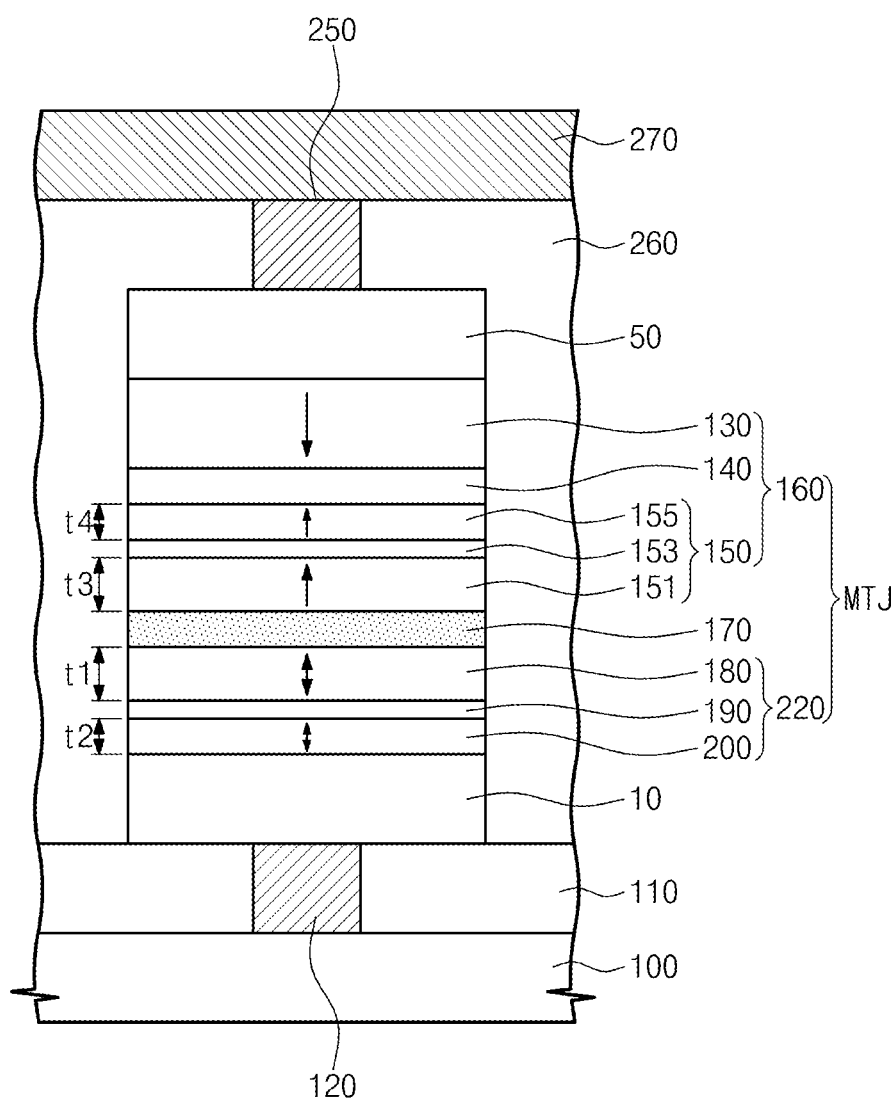

FIG. 7 is a sectional view illustrating a modification of a magnetic memory device according to still other example embodiments of the inventive concepts.

Like reference numbers refer to like elements in the same configuration of the magnetic memory device of FIG. 6 according to example embodiments of the inventive concepts, and for convenience of description, overlapping descriptions are omitted.

Referring to FIG. 7, an MTJ including a sequentially-stacked free layer 220, tunnel barrier layer 170, and pinned layer 160 may be displayed on a substrate 100. That is, unlike the semiconductor memory device described with reference to FIG. 6, the free layer 220 may be interposed between the tunnel barrier layer 170 and the first conductive structure 10, and the pinned layer 160 may be disposed between the tunnel barrier layer 170 and the second conductive structure 50.

The pinned layer 160 may include a first vertical magnetic layer 130 on the tunnel barrier layer 170, a second vertical magnetic layer 150 between the first magnetic layer 130 and the tunnel barrier layer 170, and an exchange coupled layer 140 between the first vertical magnetic layer 130 and the second vertical magnetic layer 150. In more detail, the first vertical magnetic layer 130 may be disposed between the second conductive structure 50 and the exchange coupled layer 140, and the second vertical magnetic layer 150 may be disposed between the exchange coupled layer 140 and the tunnel barrier layer 170.

The second vertical magnetic layer 150 may include a first sub magnetic layer 151 between the exchange coupled layer 140 and the tunnel barrier layer 170, a second sub magnetic layer 155 between the first sub magnetic layer 151 and the exchange coupled layer 140, and a sub layer 153 between the first sub magnetic layer 151 and the second sub magnetic layer 155. However, according to other example embodiments, the sub layer 153 may be omitted.

The free layer 220 may include a third vertical magnetic layer 180 on the first conductive structure 10, a fourth vertical magnetic layer 200 between the third vertical magnetic layer 180 and the first conductive structure 10, and a first layer 190 between the third vertical magnetic layer 180 and the fourth vertical magnetic layer 200. However, according to other example embodiments of the inventive concepts, the first layer 190 may be omitted.

The third vertical magnetic layer 180 may include B, and an at % of B in the fourth vertical magnetic layer 200 may be lower than that in the third vertical magnetic layer 180. According to other example embodiments, the fourth vertical magnetic layer 200 may include Co or Co alloys. A value multiplied by a saturation magnetization $M_{s2}$ of the fourth vertical magnetic layer 200 and a thickness t2 of the fourth vertical magnetic layer 200 may be less than a value multiplied by a saturation magnetization $M_{s1}$ of the third vertical magnetic layer 180 and a thickness t1 of the third vertical magnetic layer 180.

The first sub magnetic layer 151 may include B, and an at % of B in the second sub magnetic layer 155 may be lower than that in the first sub magnetic layer 151. According to other example embodiments, the first sub magnetic layer 151 may include Fe or Fe alloys. A value multiplied by a saturation magnetization $M_{s4}$ of the second sub magnetic layer 155 and a thickness t4 of the second sub magnetic layer 155 may be less than a value multiplied by a saturation magnetization $M_{s3}$ of the first sub magnetic layer 151 and a thickness t3 of the first sub magnetic layer 151.

According to example embodiments of the inventive concepts, the free layer 220 and/or the pinned layer 160 may include magnetic layers having different B contents. Due to an annealing process, B in the magnetic layers having a relatively high B content may easily spread into magnetic layers having a relatively low B content. Accordingly, even when the annealing process is performed at a low temperature (e.g., below about 300° C.), due to a B concentration difference between magnetic layers, as the B in the magnetic layers having a relatively high B content easily spreads into magnetic layers having a relatively low B content, the TMR of the MTJ may be increased.

Figure 8:
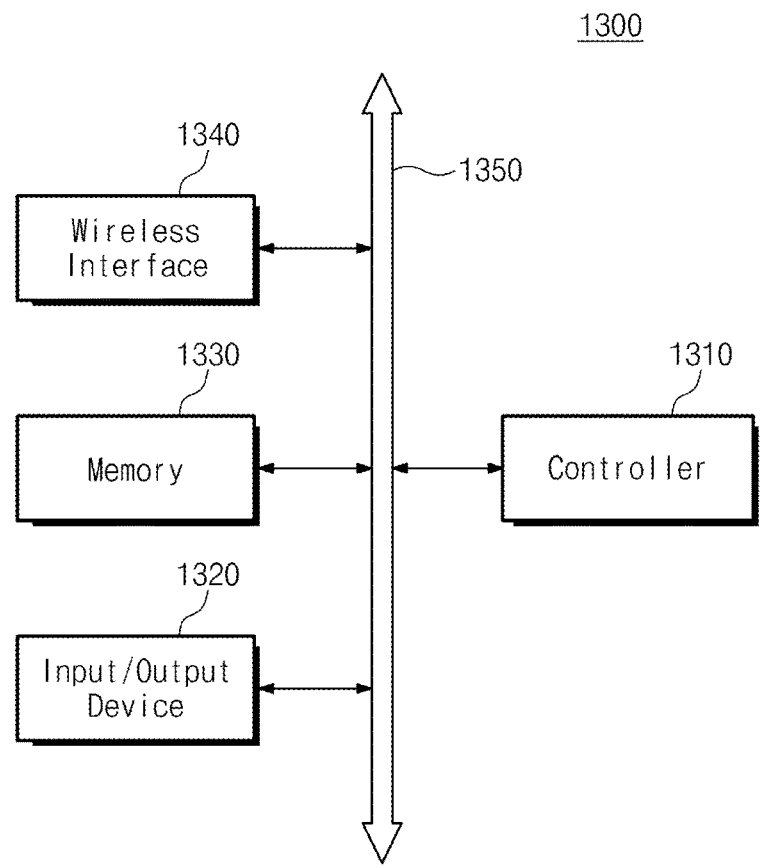
Figure 9:
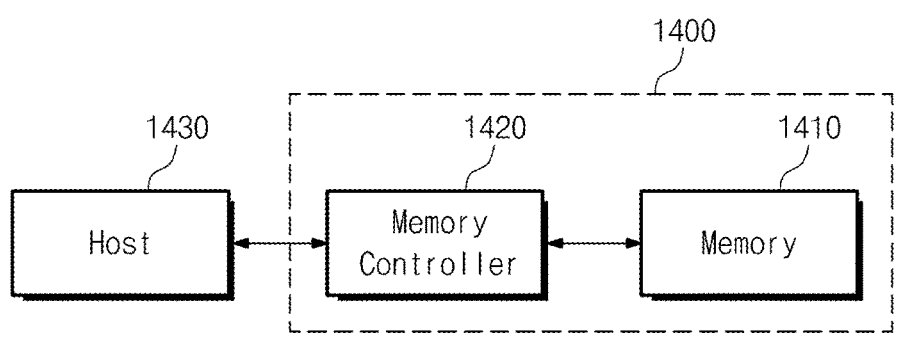

FIGS. 8 and 9 are views illustrating electronic devices including a semiconductor device according to example embodiments of the inventive concepts.

Referring to FIG. 8, an electronic device 1300 including the semiconductor device according to example embodiments of the inventive concepts may be one of a PDA, a laptop computer, a portable computer, a web tablet, a wireless phone, a mobile phone, a digital music player, a wired/wireless electronic device, and a complex electronic device including at least thereof. The electronic device 1300 may include a controller 1310, an input/output device 1320 such as a keypad, a keyboard, and a display, a memory 1330, and a wireless interface 1340, which are connected via a bus 1350. For example, the controller 1310 may include at least one microprocessor, digital signal processor, micro controller, or processor similar thereto. The memory 1330 may be used for storing a command executed by the controller 1310. The memory 1330 may be also used for storing user data, and may include a semiconductor device according to example embodiments of the inventive concepts. The electronic device 1300 may use the wireless interface 1340 to transmit data to a wireless communication network through an RF signal or receive data from a network. For example, the wireless interface 1340 may include an antenna and a wireless transceiver. The electric device 1300 may be used to implement a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 9, a semiconductor device according to example embodiments of the inventive concepts may be used to implement a memory system 1400. The memory system 1400 may include a memory device 1410 and a memory controller 1420 to store a large amount of data. The memory controller 1420 controls the memory device 1410 to read or write data from or into the memory device 1410 in response to a read/write request of a host 1430. The memory controller 1420 may configure an address mapping table to map an address from the host 1430 such as a mobile device or a computer system into a physical address of the memory device 1410. The memory device 1410 may include the semiconductor device according to the example embodiments of the inventive concepts.

A package where the semiconductor device according to the example embodiments of the inventive concepts is mounted may further include a controller controlling the semiconductor device and/or a logic device.

According to example embodiments of the inventive concepts, a free layer and/or a pinned layer may include magnetic layers having different B contents. Therefore, even when an annealing process is performed at a low temperature, due to a B concentration difference between magnetic layers, B in magnetic layers having a high B content easily spreads into magnetic layers having a low B content, so that a tunnel magnetic resistance of a magnetic tunnel junction may be increased.

The above-disclosed subject matter is to be considered illustrative and not restrictive, and the appended claims are intended to cover all such modifications, enhancements, and other example embodiments, which fall within the true spirit and scope of the example embodiments of the inventive concepts. Thus, to the maximum extent allowed by law, the scope of the example embodiments of the inventive concepts is to be determined by the broadest permissible interpretation of the following claims and their equivalents, and shall not be restricted or limited by the foregoing detailed description.

What is claimed is:

1. A magnetic memory device, comprising:
a magnetic tunnel junction including a free layer, a pinned layer, and a tunnel barrier layer between the free layer and the pinned layer,
wherein at least one of the free layer and the pinned layer includes,
a first magnetic layer on the tunnel barrier layer and including boron, and
a second magnetic layer on the first magnetic layer and including boron,
wherein the first magnetic layer is crystallized,
wherein a magnetization direction of the first magnetic layer is parallel to a magnetization direction of the second magnetic layer,
wherein the first magnetic layer is between the tunnel barrier layer and the second magnetic layer,
wherein a thickness of the second magnetic layer is thinner than a thickness of the first magnetic layer, and
wherein the second magnetic layer has a lower boron content than the first magnetic layer.

2. The device of claim 1, wherein a magnetization direction of the free layer is parallel or antiparallel to a magnetization direction of the pinned layer.

3. The device of claim 1, wherein an atomic percentage of boron in the first magnetic layer is about 20 at %.

4. The device of claim 1, wherein
the free layer includes the first and second magnetic layers,
the pinned layer includes,
   a third magnetic layer on the tunnel barrier layer and including boron, and
   a fourth magnetic layer on the third magnetic layer and including boron,
the third magnetic layer is crystallized, and
the third magnetic layer is between the tunnel barrier layer and the fourth magnetic layer.

5. The device of claim 1, wherein the pinned layer includes the first and second magnetic layers, and
the magnetization direction of the first magnetic layer is parallel to the magnetization direction of the second magnetic layer.

6. A magnetic memory device, comprising:
a magnetic tunnel junction including a free layer, a pinned layer, and a tunnel barrier layer between the free layer and the pinned layer,
wherein at least one of the free layer and the pinned layer includes,
   a crystallized first vertical magnetic layer on the tunnel barrier layer and including boron (B), and
   a second vertical magnetic layer on the crystallized first vertical magnetic layer and having boron, the second vertical magnetic layer having a lower B content than the crystallized first vertical magnetic layer,
wherein a magnetization direction of the crystallized first magnetic layer is parallel to a magnetization direction of the second vertical magnetic layer,
wherein the crystallized first vertical magnetic layer is between the tunnel barrier layer and the second vertical magnetic layer, and
wherein a thickness of the second vertical magnetic layer is thinner than a thickness of the crystallized first vertical magnetic layer.

7. The device of claim 6, wherein a value multiplied by a saturation magnetization of the second vertical magnetic layer and the thickness of the second vertical magnetic layer is less than a value multiplied by a saturation magnetization of the crystallized first vertical magnetic layer and the thickness of the crystallized first vertical magnetic layer.

8. The device of claim 6, wherein
the magnetic tunnel junction is on a substrate; and
the pinned layer is between the substrate and the tunnel barrier layer.

9. The device of claim 6, wherein
the magnetic tunnel junction is on a substrate; and
the free layer is between the substrate and the tunnel barrier layer.

10. The device of claim 6, wherein
the pinned layer includes,
   a third vertical magnetic layer on the tunnel barrier layer,
   a fourth vertical magnetic layer between the third vertical magnetic layer and the tunnel barrier layer, and
   an exchange coupled layer between the third vertical magnetic layer and the fourth vertical magnetic layer, and
wherein the fourth vertical magnetic layer includes the crystallized first vertical magnetic layer and the second vertical magnetic layer.

11. The device of claim 6, wherein one side of the crystallized first vertical magnetic layer contacts one side of the tunnel barrier layer.

12. The device of claim 6, wherein the second vertical magnetic layer includes at least one of Fe, Co, Ni, Fe including a non-magnetic metal material, Co including the non-magnetic metal material, Ni including the non-magnetic metal material, and alloys thereof.

13. The device of claim 12, wherein the non-magnetic metal material includes at least one of Ta, Ti, Zr, Hf, B, and Cr.

14. The device of claim 6, further comprising:
a non-magnetic metal layer between the crystallized first vertical magnetic layer and the second vertical magnetic layer.

15. The device of claim 14, wherein the non-magnetic metal layer includes at least one of Hf, Zr, Ti, Ta, and alloys thereof.

16. The device of claim 14, wherein a thickness of the non-magnetic metal layer is less than about 10 Å.

17. The device of claim 6, further comprising:
a metal oxide layer on the second vertical magnetic layer,
wherein the second vertical magnetic layer is between the metal oxide layer and the tunnel barrier layer.

18. The device of claim 17, wherein the metal oxide layer includes at least one of a tantalum oxide, a magnesium oxide, a titanium oxide, a zirconium oxide, a hafnium oxide, and a zinc oxide.

19. The device of claim 17, wherein a resistance of the metal oxide layer is at least ⅓ less than a resistance of the tunnel barrier layer.

* * * * *